United States Patent [19]

Vermeersch et al.

[11] Patent Number: 5,776,653
[45] Date of Patent: Jul. 7, 1998

[54] ON THE PRESS DEVELOPMENT OF A DIAZO BASED PRINTING PLATE

[75] Inventors: Joan Vermeersch, Deinze; Eric Verschueren, Merksplas; Dirk Kokkelenberg, St. Niklaas, all of Belgium

[73] Assignee: AGFA-Gevaert, N.V., Mortsel, Belgium

[21] Appl. No.: 760,341

[22] Filed: Dec. 4, 1996

Related U.S. Aplication Data

[60] Provisional application No. 60/011,906 Feb. 20, 1996.

[30] Foreign Application Priority Data

Dec. 7, 1995 [EP] European Pat. Off. ........... 95203377

[51] Int. Cl.⁶ .................. G03F 7/30; G03F 7/11; G03F 7/021
[52] U.S. Cl. .................. 430/169; 430/157; 430/158; 430/159; 430/160; 430/303
[58] Field of Search .................. 430/157, 158, 430/159, 160, 303, 169

[56] References Cited

U.S. PATENT DOCUMENTS 5,225,309 7/1993 Suzuki et al. .................. 430/175
5,260,167 11/1993 Sasa et al. .................. 430/159

*Primary Examiner*—John S. Chu
*Attorney, Agent, or Firm*—Breiner & Breiner

[57] ABSTRACT

According to the present invention there is provided a method for making a lithographic printing plate comprising the steps of:

(1) image-wise exposing an imaging element having of a flexible film support in the order given (i) a uniform ink-repellant layer comprising a cross-linked hydrophilic binder and (ii) a photosensitive layer comprising a diazonium salt or a diazo resin;

(2) and developing a thus obtained image-wise exposed imaging element by mounting it on a print cylinder of a printing press and wiping it with a disposable absorbing tissue moistened with water or fountain solution.

10 Claims, No Drawings

ON THE PRESS DEVELOPMENT OF A DIAZO BASED PRINTING PLATE

DESCRIPTION

1. Field of the Invention

This application is a non-provisional application of provisional application No. 60/011,906 filed Feb. 20, 1996.

The present invention relates to a method for making a printing plate involving the use of a diazo based printing plate. In particular, the method of the present invention involves on press development of a diazo based printing plate without the production of wet waste.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Several types of supports can be used for the manufacturing of a diazo-sensitized lithographic printing plate. Common supports are metal supports like Al or Zn and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3971660).

It is known to use as hydrophilic layer in these systems a layer containing polyvinyl alcohol and hydrolyzed tetraethyl orthosilicate and preferably also silicium dioxide and/or titanium dioxide as described in e.g. EP-A 601240, GB-P-1419512, FR-P-2300354, U.S. Pat. No. 3971660 and 4284705. This hydrophilic layer is overcoated with a light-sensitive layer containing a diazo resin or a diazonium salt in a polymeric binder.

Upon image-wise exposure of the light-sensitive layer the exposed image areas become developer insoluble and the unexposed areas remain developer soluble. The plate is then developed with a developer to remove the diazonium salt or diazo resin in the unexposed areas.

Most comercially available lithographic printing plates as described above use a special developer and are not developable in water or in a commercial dampening solution. When developing these printing plates wet waste is produced.

Commercially available diazo based printing plates most commonly use an anodized and roughened aluminum as a support having a hydrophilic surface. However, commercial plates are also available that use a flexible support such as paper provided with a hydrophilic layer that offer a advantage of cost over aluminum based printing plates. For example, Lithocraft 10008 FOTOPLATTE™ is a diazo based printing plate that comprises on a paper support a hydrophilic layer on top of which is provided a diazo based photosensitive layer. According to plate instructions of the supplier, a plate can be prepared by image-wise exposure of the lithographic printing plate precursor or imaging element, mounting the exposed imaging element on the press and wiping its surface with Lithocrafte 10008 Developer Desensitizer. The plate instructions also contemplate a method wherein no developer desensitizer is used. However, such method most often results in poor lithographic performance so that in practice a Developer Desensitizer is almost always needed. This problem is particularly apparent when the imaging element was stored for a long time before using it in making a printing plate.

Hydroprint, a lithographic printing plate on polyester sold by Agfa-Gevaert, Belgium, can be developed with plain water with good lithographic results. This has the advantage that no chemistry is needed so that said development is safer and more convenient for the printer and that there is less organic pollution of the environment However in most cases said lithographic plate becomes dry or is exposed to daylight after the development step. The exposure to daylight or starting printing with a dry plate give lithographic problems such as fog, increased dot gain, fingerprints, etc.

Development of such a water developable diazo based printing plate having a flexible support on a printing press thus potentially has the advantage that the plate does not become dry or is not exposed to daylight resulting in a further cost reduction and moreover more convenience for a printer.

SUMMARY OF THE INVENTION

It is an object of the present invention to improve the lithographic performance of a diazo based printing plate comprising as a lithographic base a flexible support provided with an ink-repellant layer when used in on the press development and whereby no wet waste is produced.

Further objects of the present invention will become clear from the description hereinafter.

According to the present invention there is provided a method for making a lithographic printing plate comprising the steps of:

(1) image-wise exposing an imaging element having on a flexible film support in the order given (i) a uniform ink-repellant layer comprising a cross-linked hydrophilic binder and (ii) a photosensitive layer comprising a diazonium salt or a diazo resin;

(2) and developing a thus obtained image-wise exposed imaging element by mounting it on a print cylinder of a printing press and wiping it with a disposable absorbing tissue moistened with water or fountain solution.

The present invention also provides a method for making multiple copies of an original comprising the steps of:

(1) image-wise exposing an imaging element having on a flexible film support in the order given (i) a uniform ink-repellant layer comprising a cross-linked hydrophilic binder and (ii) a photosensitive layer comprising a diazonium salt or a diazo resin;

(2) mounting a thus obtained image-wise exposed imaging element on a print cylinder of a printing press and wiping it with a disposable absorbing tissue moistened with water or fountain solution;

(3) subsequently rotating said print cylinder while supplying an aqueous dampening liquid and/or supplying ink to said photosensitive layer of said imaging element and (4) transfering ink from said imaging element to a receiving element, which is generally a sheet of paper.

DETAILED DESCRIPTION OF THE INVENTION

It has been found that by development of an imaging element in accordance with the present invention on the printing press, excellent lithographic performance is obtained in case a flexible film support provided with a cross-linked hydrophilic binder layer as an ink-repellant layer is used. Moreover, no particular liquid such as a developer desensitizer needs to be wiped on the exposed imaging element to achieve this lithographic performance. It has further been found that only solid waste is produced during the development of said imaging element.

Preferably, the disposable absorbing tissue in accordance with the present invention is an absorbing paper, more preferably with a swell capacity of at least 2. The swell capacity of a tissue is defined as : weight at maximum water absorption—dry weight/ dry weight. Suitable papers are e.g. Edetfort 350 and Kimtex Magnum tissue (trade name from Kimberley-Clark).

After mounting an image-wise exposed imaging element on a print cylinder of a printing press and wiping it with a disposable absorbing tissue moistened with water or fountain solution the print cylinder is subsequently rotated while supplying an aqueous dampening liquid and/or supplying ink. Subsequently in this context means that drying of the plate or excessive exposure to daylight is not possible. The time between wiping the image-wise exposed imaging element and the start of the printing may depend on the climatic conditions in the printing room but is preferably less than 30 min., more preferably less than 20 min., most preferably less than 10 min.

An exposed imaging element in accordance with the present invention is preferably mounted on a printing press and used to print shortly after the exposure. It is however possible to store an exposed imaging element for some time in the dark before using it on a printing press to print copies.

The imaging element for use in accordance with the present invention comprises on a flexible film support in the order given (i) an ink-repellant layer comprising a cross-linked hydrophilic binder and (ii) a photosensitive layer comprising a diazonium salt or a diazo resin.

As hydrophilic binder in the ink repellant layer there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/ vinylmethylether copolymers. The hydrophilicity of the (co) polymer or (co)polymer mixture used is preferably the same as or higher than the hydrophilicity of polyvinyl acetate hydrolyzed to at least an extent of 60 percent by weight, preferably 80 percent by weight.

According to a highly preferred embodiment in connection with the present invention, a hydrolyzed tetraalkyl orthosilicate cross-linker is used to cross-link the hydrophilic binder. However, other cross-linkers can be used such as e.g. a formaldehyde, glyoxal, polyisocyanate etc...

Examples of hydrolyzed tetraalkyl orthosilicate crosslinking agents are hydrolyzed tetraethyl orthosilicate and hydrolyzed tetramethyl orthosilicate.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

The ink repellant layer in the imaging element used in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the ink repellant layer is given a uniform rough texture consisting of microscopic hills and valleys, which serve as storage places for water in background areas.

The thickness of the ink repellant layer in the material of this invention may vary in the range of 0.2 to 25 μm and is preferably 1 to 10 μm.

Particular examples of suitable ink-repellant layers for use in accordance with the present invention are disclosed in EP-A 601240, GB-P-1419512, FR-P-2300354, U.S. Pat. No. 3971660, U.S. Pat. No. 4284705 and EP-A 514490.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acidic medium.

Preferred diazonium salts or resins are diazonium salts or resins of p-aminodiphenylamine containing as substituent an alkyl or alkoxy group and the weight percentage of said diazonium salt(s) and/or diazo resin(s) containing or being a diazonium salt of p-aminodiphenylamine containing as substituent an alkyl or alkoxy group versus the total amount of diazo resin and/or diazonium salt ranges between 22 and 40%. More preferably said substituent contains from 1 to 4 carbon atoms, still more preferably 1 or 2 carbon atoms. Even more preferably said substituent is an alkoxy group. Particularly preferably said diazo resin or diazonium salt containing or being a diazonium salt of p-aminodiphenylamine containing as substituent an alkyl or alkoxy group is a 3-methoxydiphenylamine-4-diazonium salt. Most preferably said diazo resin or diazonium salt containing or being a diazonium salt of p-aminodiphenylamine containing as substituent an alkyl or alkoxy group is a salt of the condensation product of formaldehyde with a 3-methoxy-diphenylamine-4-diazonium salt.

The light sensitive layer of an imaging element in connection with the present invention preferably also contains a hydrophilic binder. A suitable hydrophilic binder is for example pullulan.

Pullulan is a polysacharide that is produced by microorganisms of the Aureobasidium pullulans type (Pullularia pulluians) and that contains maltotriose repeating units connected by a α-1,6 glycosidic bond. Pullulan is generally produced on industrial scale by fermentation of partially hydrolysed starch or by bacterial fermentation of sucrose. Pullulan is commmmercially available from e.g. Shodex, Pharmacosmos.

Alternatively the light sensitive layer may contain polyvinylacetate hydrolysed to an extent of at least 95% by weight as a binder, more preferably to an extent of at least 97% by weight.

Preferably the light sensitive layer further includes a cationic fluor containing surfactant, preferably a perfluorinated surfactant and more preferably a perfluorinated ammonium surfactant. Typical examples of perfluorinated ammonium surfactants are: n.$C_8F_{17}SO_2NH$—$(CH_2)_3N^+(CH_3)_3I^-$ (Fluorad FC 135 from 3M) n.$C_9F_{19}SO_2NH$—$(CH_2)_4N^+(CH_3)_3Br^-$ n.$c_7F_{15}CONH$—$(CH_2)_3N^+(CH_3)_3I^-$ (n.$C_8F_{17}COO$—$(CH_2)_4)_2N^+(CH_3)_2I^-$ The light sensitive layer according to the present invention preferably also contains dispersed water-insoluble polymers. Said aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, maleic anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

The thickness of the photosensitive layer in the material of this invention may vary in the range of 0.1 to 10 µm and is preferably between 0.5 and 2.5 µm.

The photosensitivity of an imaging element in connection with the present invention is preferably such that an exposure to daylight to an extent of not more than 250 000 lux.s does not substantially result in changes in the lithographic behaviour of the printing plate. This will allow sufficient convenience in handling and mounting of an image-wise exposed imaging element. The photosensitivity of the imaging element may be easily adapted by appropriate choice of a particular diazo resin or diazonium salt, the amount thereof and the thickness of the photosensitive layer.

The imaging element in connection with the present invention advantageously contains water-soluble dyes such as rhodamines, sudan blue, methylen blue, eosin or trifenylmethane dyes such as crystal violet, victoria pure blue, malachite green, methylviolet and fuchsin or dye pigments. These colorants may be incorporated in the photosensitive layer and/or ink-repellant layer.

Suitable supports that can be used in an imaging element in accordance with the present invention are e.g. photographic film bases e.g. substrated polyethylene terephthalate film, substrated polyethylene naphthalenedicarboxylate film, cellulose acetate film, plastics having a metal layer or deposit thereon, and polyolefin (e.g. polyethylene) coated paper, the polyolefin surface of which may have been subjected to a corona discharge to improve the adherence of a hydrophilic layer.

One or more subbing layers may be coated between the support and the hydrophilic layer for use in accordance with the present invention in order to get an improved adhesion between these two layers.

A preferred subbing layer for use in connection with the present invention is a subbing layer comprising a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 100 m² per gram, more preferably a surface area of at least 300 m² per gram.

The surface area of the colloidal silica is determined according to the BET-value method described by S. Brunauer, P. H. Emmett and E. Teller, *J.Amer. Chem. Soc.* 60, 309–312 (1938).

The silica dispersion may also contains other substances, e.g. aluminium salts, stabilising agents, biocides etc.

Such types of silica are sold under the name KIESELSOL 100, KIESELSOL 300 and KIESELSOL 500 (KIESELSOL is a registered trade name of Farbenfabriken Bayer AG, Leverkusen, West-Germany whereby the number indicates the surface area in m² per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per m² but less than 750 mg per m², more preferably between 250 mg per m² and 500 mg per m².

The coating of the above defined subbing layer composition preferably proceeds from an aqueous colloidal dispersion optionally in the presence of a surface-active agent.

According to a preferred embodiment in connection with the present invention there is provided an intermediate layer of an organic compound having cationic groups between the hydrophilic layer and the light sensitive layer as described in EP-A 601240. As a consequence the development by plain water of such a diazo based imaging element is improved.

Organic compounds having cationic groups for use in an intermediate layer are preferably hydrophilic and may be low moleculair weight compounds but are preferably polymers. Preferred compounds are those having one or more ammonium groups or amino groups that can be converted to ammonium groups in an acidic medium. An especially preferred type of cationic compounds are polycharides modified with one or more groups containing an ammonium or amino group.

Most preferred organic compounds having cationic groups are dextrans or pullulan wherein at least some of the hydroxy groups of the dextran or pullulan has been modified into one or more of the following groups:

—O—R$^1$

—O—CO—R$^2$ wherein R$^1$ represents an organic residue containing an amino or ammonium group, e.g. an amine substituted alkyl, an amine substituted alkylaryl etc.

R$^2$ has one of the significances given for R$^1$ or stands for —OR$^3$ or —N(R$^4$)R$^5$, wherein R$^3$ has one of the significances gives for R$^1$ and each of R$^4$ and R$^5$ which may be the same or different have one of the significances given for R$^1$.

Examples of dextrans or pullulan that can be used in accordance with the present invention are dextrans or pullulan wherein some of the hydroxyl groups have been modified in one of the groups shown in table 1.

TABLE 1

| no. | modified group |
|---|---|
| 1 | —O—CH$_2$—CH$_2$—NH$_2$ |
| 2 | —O—CO—NH—CH$_2$—CH$_2$—NH$_2$ |
| 3 | —O—CO—NH—CH$_2$—CH$_2$—N(CH$_2$—CH$_2$—NH$_2$)$_2$ |
| 4 | —O—CH$_2$—CH$_2$—NH—CH$_2$—CH$_2$—NH$_2$ |
| 5 | —O—CH$_2$—CH$_2$—NH—CH$_2$—CHOH—CH$_2$—N$^+$(CH$_3$)$_3$ Cl$^-$ |
| 6 | —O—(CH$_2$—CH$_2$—O)$_n$—CH$_2$—CH$_2$—NH$_2$ wherein n represents an integer from 1 to 50 |
| 7 | —O—CO—NH—CH$_2$—CH$_2$—NH—CH$_2$—CHOH—CH$_2$—N$^+$(CH$_3$)$_3$ Cl$^-$ |
| 8 | —O—CH$_2$—CH$_2$—N(CH$_2$—CH$_3$)$_2$ .HCl |
| 9 | —O—CH$_2$—CH$_2$—N(CH$_2$—CH$_2$—NH$_2$)$_2$ |
| 10 | —O—CONH—CH$_2$—CH$_2$—N(CH$_2$—CH$_2$—NH$_2$)$_2$ |
| 11 | —O—CONH—(CH$_2$—CH$_2$—O)$_n$—CH$_2$—CH$_2$—NH$_2$ |

The modified dextrans or pullulan can be prepared by a reaction of a dextran with e.g. alkylating agents, chloroformates, acid halides, carboxylic acids etc. . .

An intermediate layer containing the organic compound having one or more cationic groups is preferably provided in an amount of 5 to 500 mg/m$^2$ and more preferably in an amount of 10 to 200 mg/m$^2$.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is exposed in such a way that the image obtained thereon is right reading. The exposure may be an exposure using optics or a contact exposure.

Subsequent to image-wise exposure, the image-wise exposed imaging element is mounted on a print cylinder of a printing press with the backside of the imaging element (side of the support opposite to the side having the photosensitive layer). According to the invention a thus mounted image-wise exposed imaging element is wiped with a disposable absorbing tissue moistened with water or fountain solution. In a preferred embodiment, the printing press is then started and while the print cylinder with the imaging element mounted thereon rotates, the dampener rollers that supply dampening liquid are dropped on the imaging element and subsequent thereto the ink rollers are dropped. Generally, after about 10 resolutions of the print cylinder the first clear and useful prints are obtained.

According to an alternative method, the ink rollers and dampener rollers may be dropped simultaneously or the ink rollers may be dropped first.

Suitable dampening liquids that can be used in connection with the present invention are aqueous liquids generally having an acidic pH and comprising an alcohol such as isopropanol. With regard to dampening liquids useful in the present invention, there is no particular limitation and commercially available dampening liquids, also known as fountain solutions, can be used.

EXAMPLE 1

Preparation of a lithographic base.

To 440 g of a dispersion containing 21.5 of TiO$_2$ (average particle size 0.3 to 0.4 μm) and 2.5% of polyvinyl alcohol in deionized water were subsequently added, while stirring, 250 g of a 5% of polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethyleneterephthalate film support (coated with a hydrophilic adhesion layer) to a wet coating thickness of 50 g/m$^2$, dried at 30° C., and subsequently hardened by subjecting it to a temperature of 57° C. for 1 week.

To this base was further provided an aqueous solution (pH=5) of Dormacid (a dextran modified with a diethylaminoethyl group available from Pfeifer & Langen) and a cationic wetting agent to a dry coating thickness of 30 mg Dormacid per m$^2$.

The obtained element was then heated for 1 week at 57° C.

Preparation of the imaging elements.

An imaging element according to the invention was produced by preparing the following light-sensitive composition and coating it to the above described lithographic base in an amount of 35 g/m$^2$ (wet coating amount) and drying it at 30° C.

Preparation of the light-sensitive coating.

To 63 g of a 20% dispersion of polymethylmethacrylate (particle diameter of 40 nm) stabilized with cetyltrimethylammoniumbromide in deionized water was subsequently added, while stirring, 120 g of a 5% solution of a 98% hydrolized polyvinylacetate, having a weight average molecular weight of 200 000 g/mol (MOWIOL 56–96 available from Hoechst) in water and 15 g of a dispersion containing 10% of Heliogen Blue D 7565 (available from BASF) and 5% of polyvinylalcohol (MOWIOL 56–98) in water. 46 g of a 15% solution of the condensation product of diphenylamine diazonium salt and formaldehyde (NEGALUX N18 available from PCAS) and 20 g of a 15% solution of the condensation product of methoxdiphenylamine diazonium salt and formaldehyde (DIAZO No. 8 available from Fairmount) in water were then slowly added. Finally 30 g of a 1.6% solution of a cationic fluor containing surfactant (Fluorad FC135 available from 3M) in water, and 726 ml of water were added.

Preparation of a printing plate and making copies of the original

The above described imaging element was exposed through an original (mask) to a high pressure halogen mercury vapour lamp of 1000 W at a distance of 70 cm for 90 s.

Further the imaging element was mounted on an AB Dick 360 offsetpress with VARN dampening system equipped with Van Son RB 2329 ink and fountain solution G 671c (3% in water, commercially available from AGFA-GEVAERT).

Subsequently water is applied to the plate surface using a disposable absorbing tissue wetted with water, wiping the entire plate surface and hereby removing the non-image parts. Subsequently the press is started by first dropping the dampener rollers on the wet plate for 5 revolutions and subsequent dropping the ink rollers for 5 revolutions.

Printing was started on a 80 g paper and a good printing quality was obtained without any ink uptake in the non-image parts and a screen rendering 2–80% on paper.

As absorbing paper was used: Edetfort 350.

No liquid waste has to be drained and the amount of solid waste could be limited to max. 25 g.

EXAMPLE 2

(Comparative Example)

The imaging element as described above was exposed through an original (mask) to a high pressure halogen mercury vapour lamp of 1000 W at a distance of 70 cm for 90 s, and hereafter the unexposed parts were washed-off manually:

herefore the plate was put on a flat and solid surface,

Water was applied to the plate surface, allowing the unexposed parts to dissolve, while rinsing the entire plate surface was wiped with a soft sponge using a firm pressure onto the plate surface, this was done until all non-image parts were removed, the plate surface was rinsed with water, the two latter steps were repeated briefly, excess water was removed and the plate was buffed dry with a soft paper.

The plate was further allowed to air-dry in a yellow light room (20° C. at 50% relative humidity) avoiding exposure to UTV-light during 2 hours, and hereafter mounted on an AB Dick 360 offsetpress with VARN dampening system containing the same ink and fountain as mentioned above.

Subsequently the plate is prewetted and the press is started by first dropping the dampener rollers on the plate for 5 revolutions and subsequent dropping the ink rollers for 5 revolutions. Printing on 80 g paper was started and a good printing quality was obtained without any ink uptake in the non-image parts and a screen rendering 2–70/80% on paper.

The obtained screen rendering is lower than was obtained using the method according to example 1 (method according to the invention) and some fingerprint contamination was noticed.

EXAMPLE 3

(Comparative Example)

The imaging element as described above was exposed through an original (mask) to a high pressure halogen mercury vapour lamp of 1000 W at a distance of 70 cm for 90 s, and hereafter the imaging element was mounted on an AB Dick 360 offsetpress with VARN dampening system equipped with Van Son RB 2329 ink and fountain solution G 671c (3% in water, commercially available from AGFA-GEVAERT).

Subsequently water is applied to the plate surface using a (reusable) sponge wetted with water, wiping the entire plate surface and hereby removing the non-image parts.

Subsequently the press is started by first dropping the dampener rollers on the wet plate for 5 revolutions and subsequent dropping the ink rollers for 5 revolutions.

Printing was started on a 80 g paper and a good printing quality was obtained without any ink uptake in the non-image parts and a screen rendering 2–80% on paper.

The contaminated sponge has to be properly cleaned for reuse and this requires at least 100 ml water (plate 381×254 mm) that has to be collected or may be drained.

We claim:

1. A method for making a lithographic printing plate comprising the steps of:
   (1) image-wise exposing an imaging element having on a flexible film support in the order given (i) a uniform ink-repellant layer comprising a cross-linked hydrophilic binder and (ii) a photosensitive layer comprising a diazonium salt or a diazo resin;
   (2) and developing a thus obtained image-wise exposed imaging element by mounting it on a print cylinder of a printing press and wiping it with a disposable absorbing tissue moistened with water or fountain solution.

2. A method for making a lithographic printing plate according to claim 1 wherein said disposable absorbing tissue is an absorbing paper.

3. A method for making a lithographic printing plate according to claim 2 wherein said absorbing paper has a swell capacity of at least 2.

4. A method for making a lithographic printing plate according to claim 1 wherein said hydrophilic binder is cross-linked by means of a hydrolysed tetra-alkylorthosilicate.

5. A method for making a lithographic printing plate according to claim 4 wherein said imaging element further comprises an intermediate layer being comprised between said ink-repellant layer and said photosensitive layer, said intermediate layer comprising an organic compound having a cationic group.

6. A method for making a lithographic printing plate according to claim 5 wherein said organic compound is a polyssacharide having one or more cationic groups.

7. A method for making a lithographic printing plate according to claim 1 wherein said hydrophilic binder is polyvinyl alcohol.

8. A method for making a lithographic printing plate according to claim 1 wherein said diazonium salt or diazo resin is a diazonium salt or resin of p-aminodiphenylamine containing as substituent an alkyl or alkoxy group and wherein the weight percentage of said diazonium salt and/or diazo resin containing or being a diazonium salt of p-aminodiphenylamine containing as substituent an alkyl or alkoxy group versus the total amount of diazo resin and/or diazonium salt ranges between 22 and 40%.

9. A method for making multiple copies of an original comprising the steps of:

(1) image-wise exposing an imaging element having on a flexible support in the order given (i) a uniform ink-repellant layer comprising a cross-linked hydrophilic binder and (ii) a photosensitive layer comprising a diazonium salt or a diazo resin;

(2) mounting a thus obtained image-wise exposed imaging element without development on a print cylinder of a printing press and wiping it with a disposable absorbing tissue moistened with water or fountain solution, (3) rotating said print cylinder while supplying an aqueous dampening liquid and/or supplying ink to said photosensitive layer of said imaging element and (4) transfering ink from said imaging element to a receiving element.

10. A method for making multiple copies of an original according to claim 9 wherein said disposable absorbing tissue is an absorbing paper.

* * * * *